(12) United States Patent
Park et al.

(10) Patent No.: US 10,770,484 B2
(45) Date of Patent: Sep. 8, 2020

(54) THIN FILM TRANSISTOR, A METHOD OF MANUFACTURING THE SAME, AND A DISPLAY APPARATUS INCLUDING THE SAME

(71) Applicant: SAMSUNG DISPLAY CO., LTD., Yongin-si, Gyeonggi-do (KR)

(72) Inventors: Sun Park, Yongin-si (KR); Chungi You, Yongin-si (KR); Hyuksoon Kwon, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/298,270

(22) Filed: Mar. 11, 2019

(65) Prior Publication Data

US 2019/0206900 A1    Jul. 4, 2019

Related U.S. Application Data

(62) Division of application No. 15/379,602, filed on Dec. 15, 2016, now Pat. No. 10,256,256.

(30) Foreign Application Priority Data

May 20, 2016    (KR) ........................ 10-2016-0062171

(51) Int. Cl.
| | | |
|---|---|---|
| *H01L 27/12* | (2006.01) | |
| *H01L 29/66* | (2006.01) | |
| *H01L 29/423* | (2006.01) | |
| *H01L 27/32* | (2006.01) | |
| *H01L 29/786* | (2006.01) | |

(52) U.S. Cl.
CPC ........ *H01L 27/124* (2013.01); *H01L 27/1225* (2013.01); *H01L 27/1233* (2013.01); *H01L 27/1255* (2013.01); *H01L 27/1288* (2013.01); *H01L 27/322* (2013.01); *H01L 27/3246* (2013.01); *H01L 27/3248* (2013.01); *H01L 29/42384* (2013.01); *H01L 29/66969* (2013.01);

(Continued)

(58) Field of Classification Search
None
See application file for complete search history.

(56) References Cited

U.S. PATENT DOCUMENTS 7,118,954 B1 * 10/2006 Lin ................... H01L 21/82346
                                                                438/201
2002/0070382 A1    6/2002 Yamazaki et al.
(Continued)

FOREIGN PATENT DOCUMENTS

| KR | 10-2000-0014192 | 3/2000 |
| KR | 10-2006-0078429 | 7/2006 |
| KR | 10-2014-0139773 | 12/2014 |

*Primary Examiner* — Michelle Mandala
(74) *Attorney, Agent, or Firm* — F. Chau & Associates, LLC

(57) ABSTRACT

A thin film transistor including a substrate; a semiconductor layer disposed over the substrate; a gate insulting film disposed over the semiconductor layer; and a gate electrode. The semiconductor layer includes a channel region, a source region, and a drain region. The gate insulating film includes a first region and a second region. The second region borders the first region. The gate electrode is disposed over the first region. A step shape is formed where the second region meets the first region.

9 Claims, 9 Drawing Sheets

(52) U.S. Cl.
CPC .... *H01L 29/7869* (2013.01); *H01L 29/78696* (2013.01)

(56) References Cited

U.S. PATENT DOCUMENTS

| | | |
|---|---|---|
| 2007/0210379 A1 | 9/2007 | Godo |
| 2009/0111198 A1* | 4/2009 | Fujikawa ............ H01L 27/1288 438/22 |
| 2011/0198603 A1 | 8/2011 | Choi et al. |
| 2014/0167139 A1* | 6/2014 | Chang .................. H01L 29/401 257/325 |
| 2015/0162358 A1* | 6/2015 | Inoue .................. H01L 27/1225 257/43 |
| 2016/0013441 A1 | 1/2016 | Hong |
| 2016/0204130 A1 | 7/2016 | Jung et al. |
| 2017/0338245 A1 | 11/2017 | Park et al. |

* cited by examiner

THIN FILM TRANSISTOR, A METHOD OF MANUFACTURING THE SAME, AND A DISPLAY APPARATUS INCLUDING THE SAME

CROSS-REFERENCE TO RELATED APPLICATION

This application is a divisional of U.S. application Ser. No. 15/379,602, filed on Dec. 15, 2016, which claims priority under 35 U.S.C. § 119 to Korean Patent Application No. 10-2016-0062171, filed on May 20, 2016 in the Korean Intellectual Property Office, the disclosures of which are incorporated by reference herein in their entirety.

TECHNICAL FIELD

The present invention relates to a thin film transistor, a method of manufacturing the same, and a display apparatus including the same.

DISCUSSION OF RELATED ART

Display apparatuses may be used to display images. Variations of display apparatuses include liquid crystal displays (LCD), electrophoretic displays, organic light emitting displays (OLED), inorganic light emitting displays, field emission displays, surface-conduction electron-emitter displays, plasma displays, and cathode ray displays.

A display apparatus generally includes a display device, a plurality of thin film transistors (TFTs), a plurality of capacitors, and wires used to connect the display device, the TFTs, and the capacitors. High quality TFTs may increase the quality of the display apparatus.

SUMMARY

Exemplary embodiments of the present invention provide a display apparatus. The display apparatus includes a thin film transistor (TFT), a planarizing film, a pixel electrode, a counter electrode, and an intermediate layer. The planarizing film overlaps the TFT. The pixel electrode is disposed over the planarizing film. The pixel electrode is connected to the TFT. The counter electrode faces the pixel electrode. The intermediate layer is disposed between the pixel electrode and the counter electrode. The TFT includes a semiconductor layer, a gate insulating film, and a gate electrode. The semiconductor layer is disposed over a substrate. The semiconductor layer includes a source region, a channel region, and a drain region. The gate insulating film is disposed over the semiconductor layer. The gate insulating layer includes a first region and a second region. The second region is disposed at sides of the first region. The gate electrode is disposed over the first region. A thickness of the first region is different than a thickness of the second region to form a step shape.

According to an exemplary embodiment of the present invention, an area of an upper surface of the first region may be greater than an area of a lower surface of the gate electrode.

According to an exemplary embodiment of the present invention, a distance between an end of the lower surface of the gate electrode and an end of an upper surface of the first region may be in a range from about 5 nm to about 1000 nm.

According to an exemplary embodiment of the present invention, the first region may have a substantially uniform thickness.

According to an exemplary embodiment of the present invention, the thickness of the second region may be reduced in a direction away from the first region.

According to an exemplary embodiment of the present invention, the semiconductor layer may include an oxide semiconductor.

According to an exemplary embodiment of the present invention, the gate insulating film might not cover two edges of the semiconductor layer.

According to an exemplary embodiment of the present invention, the display apparatus may further include a pixel defining layer. The pixel defining layer may expose a first region of the pixel electrode, and cover edges of the pixel electrode.

According to an exemplary embodiment of the present invention, the intermediate layer may include an organic light-emitting layer.

Exemplary embodiments of the present invention provide a method of manufacturing a thin film transistor. The method includes forming a semiconductor layer over a substrate; sequentially forming a gate insulating material layer and a gate electrode material layer on the substrate to cover the semiconductor layer; forming a first photoresist pattern on the gate electrode material layer; forming a gate electrode by etching the gate electrode material layer using the first photoresist pattern as a mask; forming a second photoresist pattern covering both sidewalls and an upper surface of the gate electrode; and forming a gate insulating film by etching the gate insulating material layer using the second photoresist pattern as a mask.

According to an exemplary embodiment of the present invention, the second photoresist pattern may be formed by reflowing the first photoresist pattern.

According to an exemplary embodiment of the present invention, the method may further include performing a conducting process to increase a carrier concentration of a portion of the semiconductor layer.

According to an exemplary embodiment of the present invention, the etching of the gate insulating material layer may include a dry etching process. The conducting process may use a gas used in the dry etching process.

According to an exemplary embodiment of the present invention, the gate insulating film may include a first region and a second region. The second region may be disposed at sides of the first region. A thickness of the first region may be different than a thickness of the second region to form a step shape.

According to an exemplary embodiment of the present invention, the gate electrode may be disposed on the first region. An upper surface of the first region may be greater than an area of a lower surface of the gate electrode.

According to an exemplary embodiment of the present invention, the thickness of the second region may be reduced in a direction away from the first region.

According to an exemplary embodiment of the present invention, the semiconductor layer may include an oxide semiconductor.

Exemplary embodiments of the present invention provide a thin film transistor. The thin film transistor includes a substrate, a semiconductor layer, a gate insulating film, and a gate electrode. The semiconductor layer is disposed on the substrate. The semiconductor layer includes a channel region, a source region, and a drain region. The gate insulating film is disposed on the semiconductor layer. The gate insulating film includes a first region and a second region. The second region borders the first region. The gate electrode is disposed on the first region. A step shape is formed where the second region meets the first region.

According to an exemplary embodiment of the present invention, a distance between an end of the lower surface of the gate electrode and an end of the upper surface of the first region may be in a range from about 5 nm to about 1000 nm.

According to an exemplary embodiment of the present invention, the first region may have a substantially uniform thickness.

BRIEF DESCRIPTION OF THE DRAWINGS

These and/or other features of the present invention will become more apparent by describing in detail exemplary embodiments thereof with reference to the accompanying drawings, in which.

DETAILED DESCRIPTION OF THE EMBODIMENTS

Figure 1:
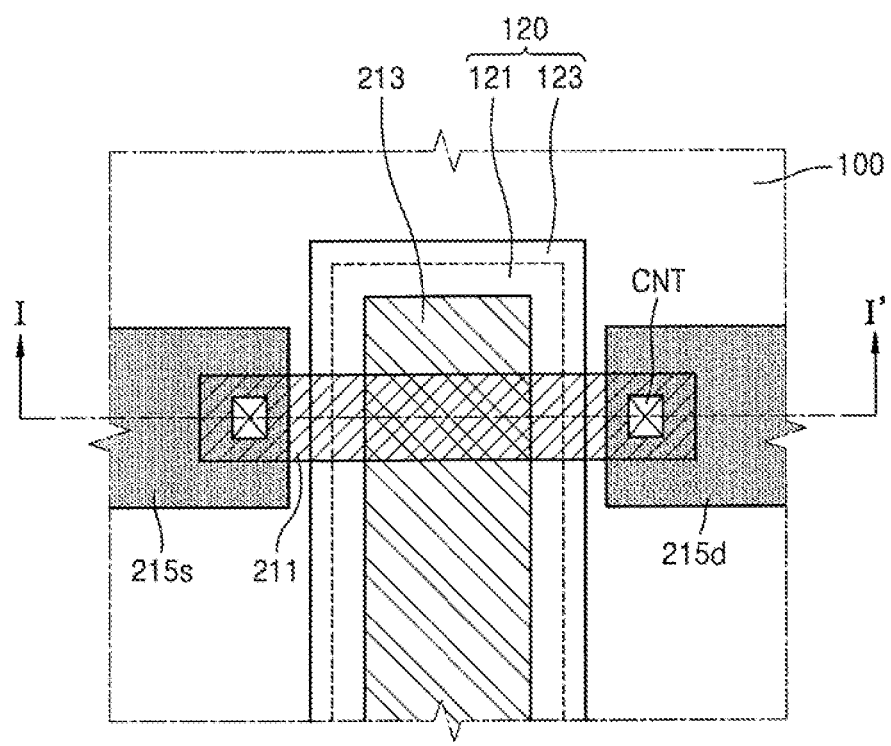
FIG. 1 is a schematic plan view illustrating a thin film transistor (TFT) according to an exemplary embodiment of the present invention.

Exemplary embodiments of the present invention will now be described in reference to the drawings. The present invention may, however, be embodied in many different forms and should not be construed as limited to the embodiments set forth herein. In the drawings, like references numerals may refer to like elements throughout. As used herein, the singular forms "a" "an" and "the" are intended to include the plural forms as well, unless the context clearly indicates otherwise.

In the drawings, the sizes of constituent elements may be reduced or exaggerated for convenience of explanation.

It is to be understood that a specific process order may be performed differently from the described order. For example, two processes consecutively described may be performed substantially at the same time, or may be performed in an order opposite to the described order.

It will be understood that when a layer, region, or component is referred to as being "connected to" or "disposed on" another layer, region, or component, it may be "directly connected to" or "directly disposed on" the other layer, region, or component or it may be "indirectly connected to" or "indirectly disposed on" the other layer, region, or component with another layer, region, or component interposed therebetween.

Figure 2:
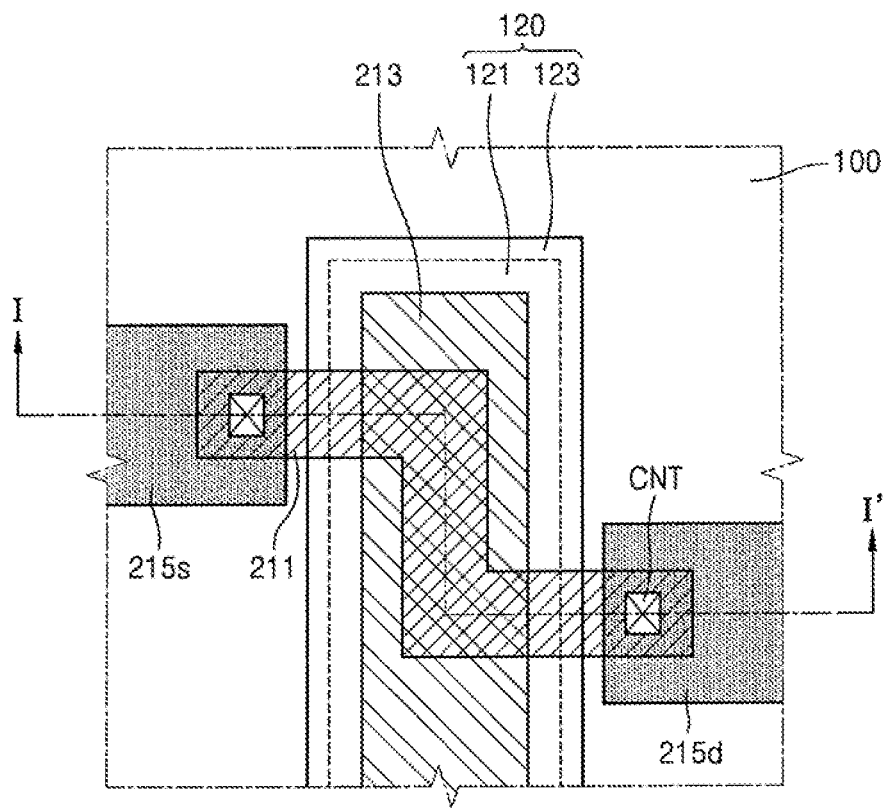
FIG. 2 is a schematic plan view illustrating a TFT according to an exemplary embodiment of the present invention.
Figure 3:
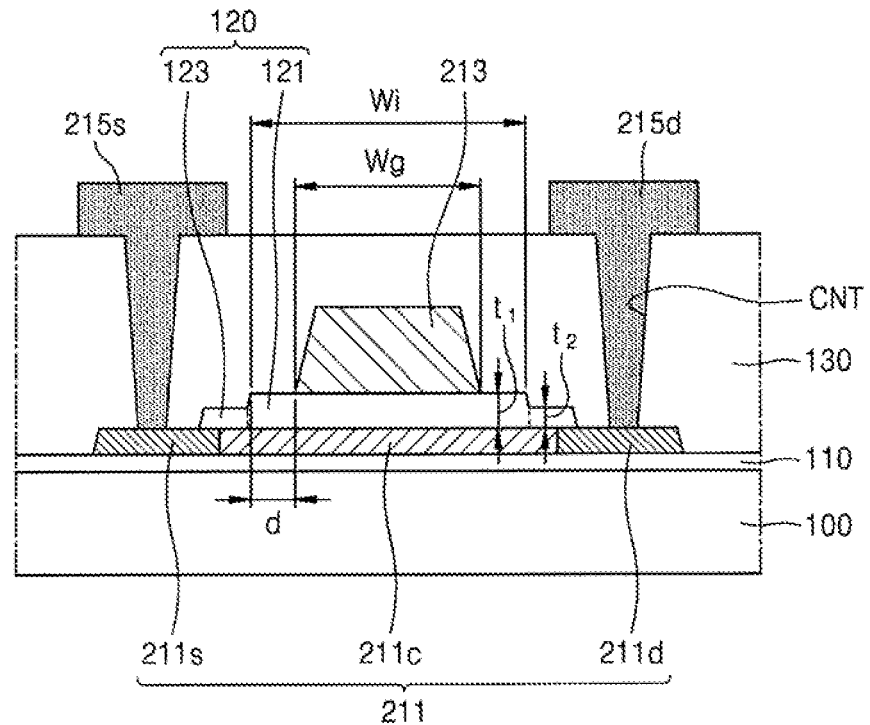
FIG. 3 is a cross-sectional view illustrating the TFTs of FIGS. 1 and 2 along a line I-I' according to an exemplary embodiment of the present invention.

FIG. 1 is a schematic plan view illustrating a thin film transistor (TFT) according to an exemplary embodiment of the present invention. FIG. 2 is a schematic plan view illustrating a TFT according to an exemplary embodiment of the present invention. FIG. 3 is a cross-sectional view of the TFTs of FIGS. 1 and 2 along a line I-I' according to an exemplary embodiment of the present invention.

Referring to FIGS. 1 to 3, a TFT may include a semiconductor layer 211, a gate insulating film 120, and a gate electrode 213. The semiconductor layer 211 may be disposed on a substrate 100. The gate insulating film 120 may be disposed on the semiconductor layer 211. The gate electrode 213 may be disposed on the gate insulating film 120. The gate insulating film 120 may include a central region 121. The gate insulating film 120 may further include a surrounding region 123. Since the central region 121 may have a thickness different than a thickness of the surrounding region 123, a step difference may be formed therebetween.

The gate insulating film 120 may include the central region 121 and the surrounding region 123. The surrounding region 123 may extend from the central region 121. A thickness t1 of the central region 121 may be different than a thickness t2 of the surrounding region 123. Accordingly, a step may be formed.

According to an exemplary embodiment of the present invention, the TFT may further include a buffer layer 110, an interlayer insulating layer 130, a source electrode 215s, and a drain electrode 215d.

The substrate 100 may include various materials, such as glass, metals, or plastic; however, exemplary embodiments of the present invention are not limited thereto. According to an exemplary embodiment of the present invention, the substrate 100 may include a flexible substrate. The flexible substrate may include a substrate that can be bent, folded, or rolled. The substrate 100 may include various flexible or bendable materials. For example, the substrate 100 may include polymer resin materials, such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), or cellulose acetate propionate (CAP); however, exemplary embodiments of the present invention are not limited thereto.

The buffer layer 110 may be disposed on the substrate 100. The buffer layer 110 may reduce or may block the penetration of foreign materials, moisture, or external air from a lower surface of the substrate 100. The buffer layer 110 may further provide a substantially flat surface on the substrate 100. The buffer layer 110 may include an inorganic material, such as an oxide or nitride, an organic material, or an organic-inorganic composite material; however, exemplary embodiments of the present invention are not limited thereto. The buffer layer 110 may include a monolayer structure or a multilayer structure. The multilayer structure may include an inorganic material or an organic material. The semiconductor layer 211 may extend to a channel region 211c. The semiconductor layer 211 may include a source region 211s. The semiconductor layer 211 may further include a drain region 211d. The source region 211s and the drain region 211d may be formed on opposite sides of the channel region 211c. The semiconductor layer 211 may include an oxide semiconductor. For example, the semiconductor layer 211 may include a metal element of Groups 12, 13, and 14, such as zinc (Zn), indium (In), gallium (Ga), tin (Sn), cadmium (Cd), germanium (Ge), and hafnium (Hf). The semiconductor layer 211 may further include an oxide of a material selected from a metal element of Groups 12, 13, and 14, such as zinc (Zn), indium (In), gallium (Ga), tin (Sn), cadmium (Cd), germanium (Ge), and hafnium (Hf) or combinations thereof. However, exemplary embodiments of the present invention are not limited thereto. According to an exemplary embodiment of the present invention, the semiconductor layer 211 may include a zinc (Zn) oxide group material, such as a zinc oxide, an In—Zn oxide, or a Ga—In—Zn oxide; however, exemplary embodiments of the present invention are not limited thereto. According to an exemplary embodiment of the present invention, the semiconductor layer 211 may be an In—Ga—Zn—O (IGZO) semiconductor. The In—Ga—Zn—O (IGZO) semiconductor may be formed by including metals, such as indium (In) and gallium (Ga) with zinc oxide (ZnO).

The source region 211s and the drain region 211d may be conductive regions. The source region 211s and the drain region 211d may be formed by increasing a carrier concentration in the semiconductor layer 211. If the semiconductor layer 211 includes an oxide semiconductor, the source region 211s and the drain region 211d may become conductive. The source region 211s and the drain region 211d may become conductive by performing plasma processing of the semiconductor layer 211. Accordingly, a carrier concentration of the source region 211s and a carrier concentration of the drain region 211d may be greater than a carrier concentration of the channel region 211c.

The shape of the channel region 211c may include various forms. As illustrated in FIG. 2, the channel region 211c may have a bent shape. The bent shape of the channel region 211c may ensure a length of a channel. The channel region 211 may be modified in various ways, for example, a '匸' shape or a '彐' shape; however, exemplary embodiments of the present invention are not limited thereto.

The gate electrode 213 may be disposed on the central region 121 of the gate insulating film 120. The gate electrode 213 may correspond to the channel region 211c. A portion of the gate electrode 213 may overlap the channel region 211c. The gate electrode 213 may be connected to a wire. The wire may apply an ON/OFF signal to the TFT. The gate electrode 213 may include a low resistance metal. For example, the gate electrode 213 may include a conductive material including molybdenum (Mo), aluminum (Al), copper (Cu), and/or titanium (Ti); however, exemplary embodiments of the present invention are not limited thereto. The gate electrode 213 may include a monolayer film or a multilayer film. According to an exemplary embodiment of the present invention, the gate electrode 213 may include a double layer of titanium/copper (Ti/Cu) or a double layer of titanium/aluminum (Ti/Al); however, exemplary embodiments of the present invention are not limited thereto. A titanium (Ti) layer may be disposed on a lower lateral surface of titanium/copper (Ti/Cu) or titanium/aluminum (Ti/Al). A thickness of the gate electrode 213 may be less than a thickness of a copper (Cu) layer and an aluminum (Al) layer. Therefore, the titanium (Ti) layer may be configured and function as a barrier.

The gate insulating film 120 may be disposed between the semiconductor layer 211 and the gate electrode 213. The gate insulating film 120 may be configured as an insulator between the semiconductor layer 211 and the gate electrode 213. The gate insulating film 120 may include an inorganic material, for example, silicon oxide, silicon nitride, and/or silicon oxynitride; however, exemplary embodiments of the present invention are not limited thereto. The gate insulating film 120 may be formed and may be patterned by a chemical vapor deposition (CVD) method or an atomic layer deposition (ALD) method.

The gate insulating film 120 may include the central region 121. The gate insulating film 120 may further include the surrounding region 123. The surrounding region 123 may extend from the central region 121. A thickness t1 of the central region 121 may be different than a thickness t2 of the surrounding region 123. Accordingly, a step may be formed. According to an exemplary embodiment of the present invention, the gate insulating film 120 might not cover an entire surface of the substrate 100. The gate insulating film 120 may be patterned to be substantially similar to the shape of the gate electrode 213. The gate insulating film 120 might not cover lateral surfaces of the semiconductor layer 211. Therefore, the source region 211s and the drain region 211d may be exposed.

The gate electrode 213 may be disposed on the central region 121. The central region 121 has a thickness t1. The surrounding region 123 may be disposed on an outer region of the central region 121. The surrounding region 123 may extend from the central region 121. The surrounding region 123 may surround at least a portion of the central region 121. An area of an upper surface of the central region 121 may be greater than an area of a lower surface of the gate electrode 213. As illustrated in FIG. 3, a width Wg of the lower surface of the gate electrode 213 may be less than a width Wi of the upper surface of the central region 121. For example, edges of the upper surface of the central region 121 may be separated from edges of the lower surface of the gate electrode 213. The upper surface of the central region 121 may be a surface facing the gate electrode 213. The lower surface of the gate electrode 213 may be a surface facing the substrate 100. A separation distance d between an end of the lower surface of the gate electrode 213 and an end of the upper surface of the central region 121 may be in a range from about 5 nm to about 1,000 nm. A maximum value of the separation distance d may be about 90% of a distance between the end of the lower surface of the gate electrode 213 and an end of an upper surface of the gate insulating film 120.

The thickness t2 of the surrounding region 123 may be less than the thickness t1 of the central region 121. Since the thickness t1 may be different than the thickness t2, a step difference may be formed at a boundary between the central region 121 and the surrounding region 123. According to an exemplary embodiment of the present invention, the thickness t1 of the central region 121 may be in a range from about 50 nm to about 200 nm. The thickness t2 of the surrounding region 123 may be in a range from about 30 nm to about 90% of the thickness t1 of the central region 121.

The step difference on the gate insulating film 120 may be formed due to a process of manufacturing the TFT according to an exemplary embodiment of the present invention. Since a photoresist pattern may surrounds sidewalls of the gate electrode 213, the occurrence of a short circuit between the gate electrode 213 and the semiconductor layer 211 may be prevented during the process of manufacturing the TFT.

The interlayer insulating layer 130 may be disposed on the gate electrode 213. The interlayer insulating layer 130 may include an inorganic material, for example, silicon oxide, silicon nitride, and/or silicon oxynitride; however, exemplary embodiments of the present invention are not limited thereto. The interlayer insulating layer 130 may be formed by a CVD method or an ALD method.

The source electrode 215s and the drain electrode 215d may be disposed on the interlayer insulating layer 130. The source electrode 215s and the drain electrode 215d may be a monolayer film or a multilayer film. The source electrode 215s and the drain electrode 215d may include a conductive material. The conductive material may have a high conductivity. The source electrode 215s and the drain electrode 215d may be respectively connected to the source region 211s and the drain region 211d. The source electrode 215s may include a monolayer structure. The drain electrode 215d may include a multilayer structure. The source electrode 215s and the drain electrode 215d may include a conductive material including aluminum (Al), copper (Cu), and/or titanium (Ti); however, exemplary embodiments of the present invention are not limited thereto. The source electrode 215s and the drain electrode 215d may be connected to each other through a contact hole CNT. The contact hole CNT may pass through the semiconductor layer 211. The contact hole CNT may also pass through the interlayer insulating layer 130.

Figure 4:
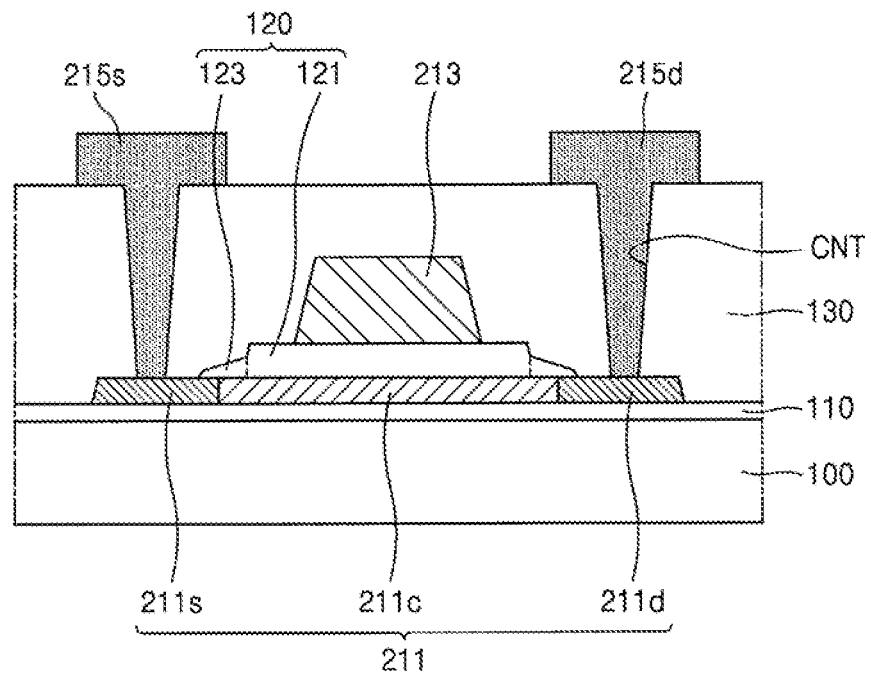
FIG. 4 is a schematic cross-sectional view illustrating a TFT according to an exemplary embodiment of the present invention.

FIG. 4 is a schematic cross-sectional view illustrating a TFT according to an exemplary embodiment of the present invention.

Referring to FIG. 3, the thickness t2 of the surrounding region 123 of the gate insulating film 120 may be substantially uniform. However, as illustrated in FIG. 4, the thickness of the surrounding region 123 may be gradually reduced in a direction away from the central region 121. Since the thickness of the central region 121 may be different than the thickness of the surrounding region 123, a step difference may be formed. The step difference may be formed at the boundary between the central region 121 and the surrounding region 123.

FIGS. 5A to 5G are cross-sectional views illustrating a method of manufacturing a TFT according to an exemplary embodiment of the present invention. Here, the TFT of FIG. 3 will be described as an example.

Figure 5A:
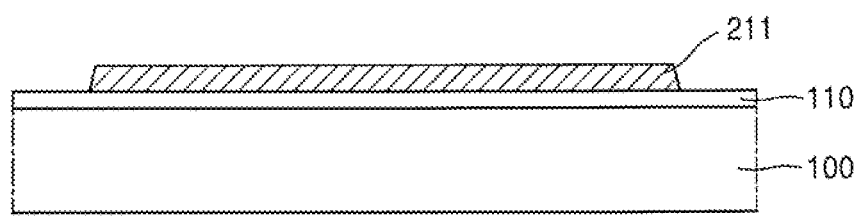
FIGS. 5A to 5G are cross-sectional views illustrating a method of manufacturing a TFT according to an exemplary embodiment of the present invention.

Referring to FIG. 5A, the buffer layer 110 and the semiconductor layer 211 may be formed on the substrate 100. The semiconductor layer 211 may include an oxide semiconductor. The semiconductor layer 211 may also include a metal element of Group 12, 13, and 14, such as zinc (Zn), indium (In), gallium (Ga), tin (Sn), cadmium (Cd), germanium (Ge), or hafnium (Hf). The semiconductor layer may also include an oxide of a material selected from a metal element of Group 12, 13, and 14, such as zinc (Zn), indium (In), gallium (Ga), tin (Sn), cadmium (Cd), germanium (Ge), or hafnium (Hf) or combinations thereof. However, exemplary embodiments of the present invention are not limited thereto. According to an exemplary embodiment of the present invention, the semiconductor layer 211 may include a zinc (Zn) oxide group material, such as a zinc (Zn) oxide, an In—Zn oxide, or a Ga—In—Zn oxide. According to an exemplary embodiment of the present invention, the semiconductor layer 211 may be an In—Ga—Zn—O (IGZO) semiconductor that is formed by including metals, such as indium (In) and gallium (Ga) with zinc oxide (ZnO).

The semiconductor layer 211 may be formed by using a CVD method, such as a sputtering method. The semiconductor layer 211 may also be formed by using a pulse laser deposition (PLD) method. However, exemplary embodiments of the present invention are not limited thereto. For example, a film may be formed of In—Ga—Zn—O (IGZO) by a CVD method. The film may be patterned to substantially the same shape of the semiconductor layer 211. The patterning of the film may be performed by a wet etching process. The wet etching process may use an acid solution, for example, hydrochloric acid (HCl), nitric acid ($HNO_3$), diluted sulfuric acid ($H_2SO_4$), or a mixture of phosphoric acid ($H_3PO_4$), nitric acid ($HNO_3$), and acetic acid ($CH_3COOH$); however, exemplary embodiments of the present invention are not limited thereto. The patterning of the film may also be performed by using a dry etching process. The patterning of the film may also be performed by using a combination of a wet etching process and a dry etching process.

Figure 5B:
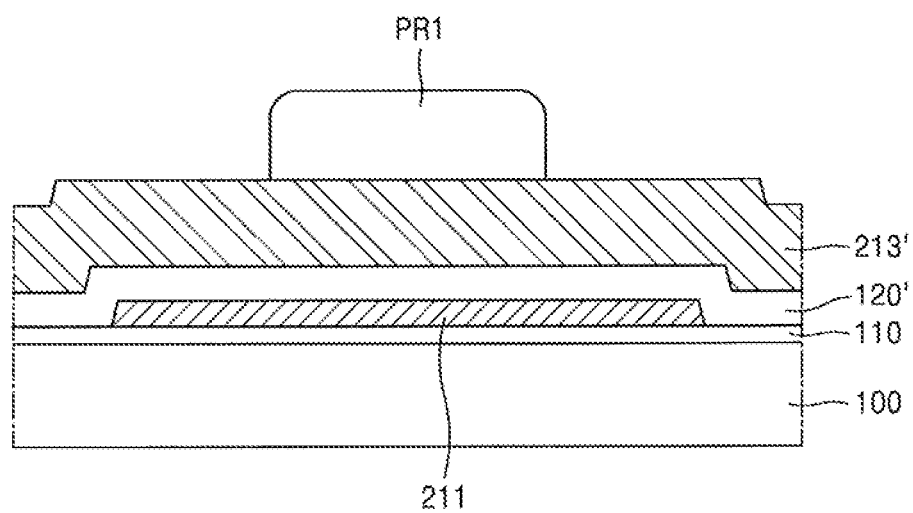

Referring to FIG. 5B, a gate insulating material layer 120' may be formed on the substrate 100. A gate electrode material layer 213' may also be formed on the substrate 100. The gate insulating material layer 120' and the gate electrode material layer 213' may cover the semiconductor layer 211.

The gate insulating material layer 120' may include an inorganic material, such as silicon oxide, silicon nitride, and/or silicon oxynitride; however, exemplary embodiments of the present invention are not limited thereto. The gate insulating material layer 120' may be formed through a CVD method or an ALD method.

The gate electrode material layer 213' may include molybdenum (Mo), aluminum (Al), copper (Cu), and/or titanium (Ti); however, exemplary embodiments of the present invention are not limited thereto. The gate electrode material layer 213' may be formed as a monolayer film or a multilayer film. The gate electrode material layer 213' may be formed by using a deposition method, for example, a CVD method, a plasma enhanced chemical vapor deposition (PECVD) method, a low pressure chemical vapor deposition (LPCVD) method, a physical vapor deposition (PVD) method, a sputtering method, or an ALD method; however, exemplary embodiments of the present invention are not limited thereto.

A first photoresist pattern PR1 may be formed on the gate electrode material layer 213'. A location of the first photoresist pattern PR1 may correspond to a location where the gate electrode 213 is formed.

Figure 5C:
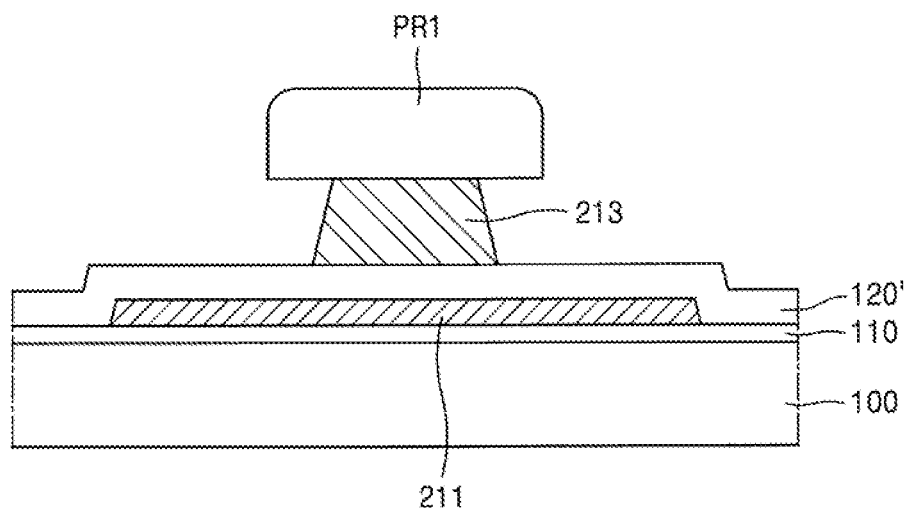

Referring to FIG. 5C, the gate electrode 213 may be formed by etching the gate electrode material layer 213' by using the first photoresist pattern PR1 as an etch mask. As illustrated in FIG. 5C, a width of the gate electrode 213 may be smaller than a width of the first photoresist pattern PR1; however, exemplary embodiments of the present invention are not limited thereto. The width of the gate electrode 213 may be substantially equal to or greater than the width of the first photoresist pattern PR1. The etching of the gate electrode material layer 213' may be performed by a wet etching method, a dry etching process, or a combination of a wet etching process and a dry etching process.

Figure 5D:
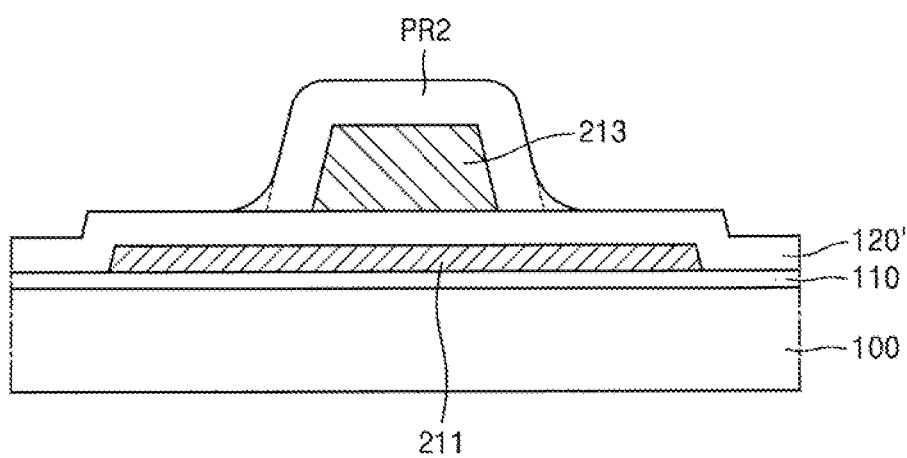

Referring to FIG. 5D, a second photoresist pattern PR2 may be formed. The second photoresist pattern PR2 may cover sidewalls and an upper surface of the gate electrode 213. The second photoresist pattern PR2 may be formed by reflowing of the first photoresist pattern PR1. The reflow process may be performed by heat treating the substrate 100 on which the first photoresist pattern PR1 is formed. The substrate 100 may be heat treated at a temperature atmosphere in a range from about 130° C. to about 250° C. The second photoresist pattern PR2 may be formed on both sidewalls and the upper surface of the gate electrode 213. Accordingly, the first photoresist pattern PR1 may flow along the both sidewalls of the gate electrode 213 by using the reflow process.

Figure 5E:
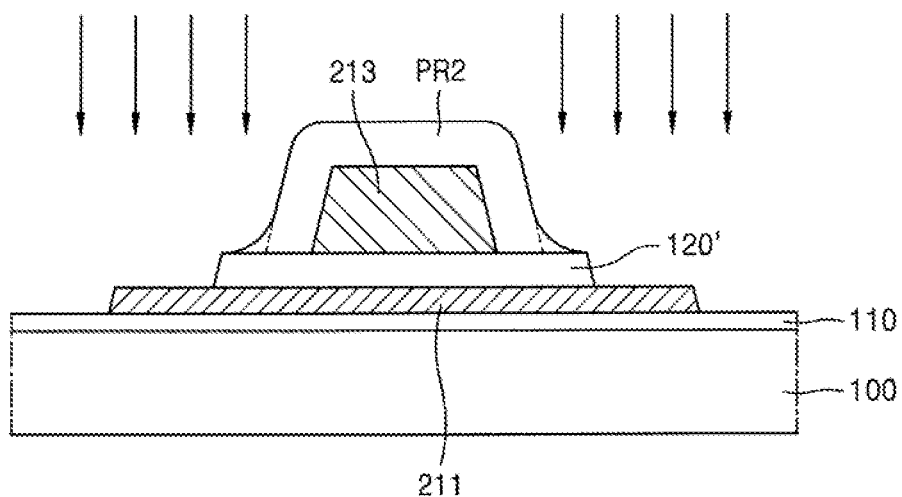
Figure 5F:
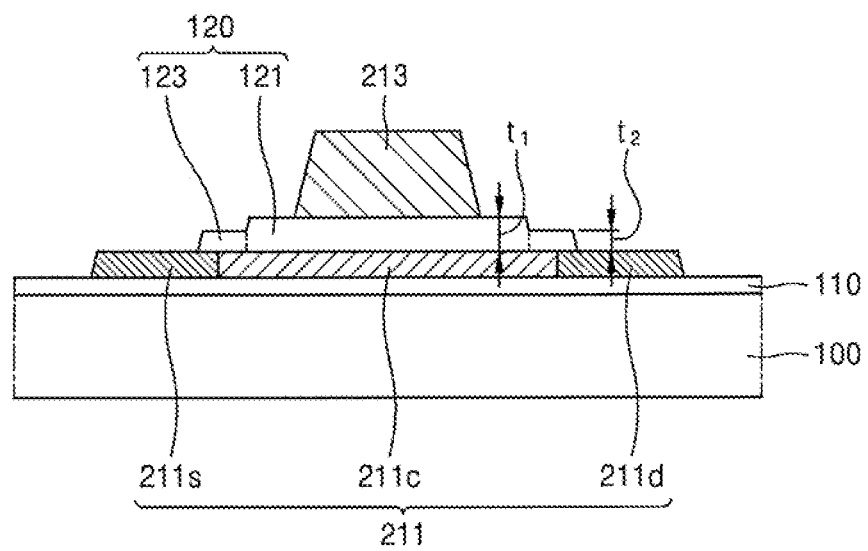

Alternatively, the second photoresist pattern PR2 may be formed by using an additional photolithography method. Referring to FIGS. 5E and 5F, the gate insulating film 120 may be formed by etching the gate insulating material layer 120' by using the second photoresist pattern PR2 as an etch mask. The source region 211s and the drain region 211d of the semiconductor layer 211 may become conductive by performing the etching process. The etching process may be dry etching using a plasma gas of methane ($CH_4$) or persulfurane ($SH_6$); however, exemplary embodiments of the present invention are not limited thereto.

The semiconductor layer 211 may be an oxide semiconductor. If the semiconductor layer 211 is an oxide semiconductor, the carrier concentration may be increased by forming an oxygen depletion state. Accordingly, the carrier concentration of the source region 211s and the carrier concentration of the drain region 211d may be increased by forming the gate insulating film 120. The gate insulating film 120 may be formed through controlling the process time of dry etching and by causing damage to the semiconductor layer 211 that is exposed and is not covered by the gate insulating film 120.

Since the edge portion of the second photoresist pattern PR2 may have a small thickness, the central region 121 and the surrounding region 123 of the gate insulating film 120 may be formed. The central region 121 and the surrounding region 123 of the gate insulating film 120 may generate a height difference. For example, the gate insulating film 120 may include the central region 121. The gate insulating film 120 may further include the surrounding region 123. The surrounding region 123 may extend from the central region 121. A thickness t1 of the central region 121 may be different than a thickness t2 of the surrounding region 123. Accordingly, a step may be formed. The gate electrode 213 may be disposed on the central region 121. The thickness t1 of the central region 121 may be substantially constant. The surrounding region 123 is may be a region surrounding the central region 121. According to an exemplary embodiment of the present invention, the central region 121 may have the thickness t1 in a range from about 50 nm to about 200 nm. The surrounding region 123 may have the thickness t2 in a range from about 30 nm to about 90% of the thickness t1 of the central region 121.

The second photoresist pattern PR2 may be formed to surround the sidewalls of the gate electrode 213. Therefore, an area of the upper surface of the central region 121 may be greater than an area of a lower surface of the gate electrode 213. Accordingly, the edge of the upper surface of the central region 121 may be separated from the edge of the lower surface of the gate electrode 213.

As illustrated in FIG. 5F, a step difference may be formed due to a height difference in a vertical cross-section between the central region 121 and the surrounding region 123; however, exemplary embodiments of the present invention are not limited thereto. The shape of the surrounding region 123 may be variously modified according to the shape of the second photoresist pattern PR2. For example, the central region 121 and the surrounding region 123 might not form a step difference. A thickness of the surrounding region 123 may be gradually reduced away from the central region 121.

According to an exemplary embodiment of the present invention, the second photoresist pattern PR2 may prevent indium (In), gallium (Ga), or zinc (Zn) that may be separated from the semiconductor layer 211 during the etching process from accumulating on the sidewalls of the gate electrode 213.

If the second photoresist pattern PR2 does not surround the sidewalls of the gate electrode 213, metal materials, such as indium (In), gallium (Ga), or zinc (Zn) separated from the semiconductor layer 211 in the etching process, may accumulate on the sidewalls of the gate electrode 213 and the gate insulating film 120. The metal materials may also be connected to the semiconductor layer 211. As a result, a short circuit between the semiconductor layer 211 and the gate electrode 213 may occur.

According to an exemplary embodiment of the present invention, since the second photoresist pattern PR2 surrounds the sidewalls of the gate electrode 213 in the etching process of the gate insulating film 120 and in the conductive process of the semiconductor layer 211, a short circuit between the semiconductor layer 211 and the gate electrode 213 may be prevented.

The separation distance between the end of the lower surface of the gate electrode 213 and the end of the upper surface of the central region 121 may be in a range from about 5 nm to about 1000 nm. The maximum separation distance may be about 90% of the distance between the end of the lower surface of the gate electrode 213 and the end of the upper surface of the gate insulating film 120. If the separation distance is less than about 5 nm, the second photoresist pattern PR2 may not be sufficiently surround the gate electrode 213. Therefore, a short circuit between the semiconductor layer 211 and the gate electrode 213 might occur.

Once the gate insulating film 120 is formed and the source region 211s and the drain region 211d become conductive, the second photoresist pattern PR2 may be removed.

Figure 5G:
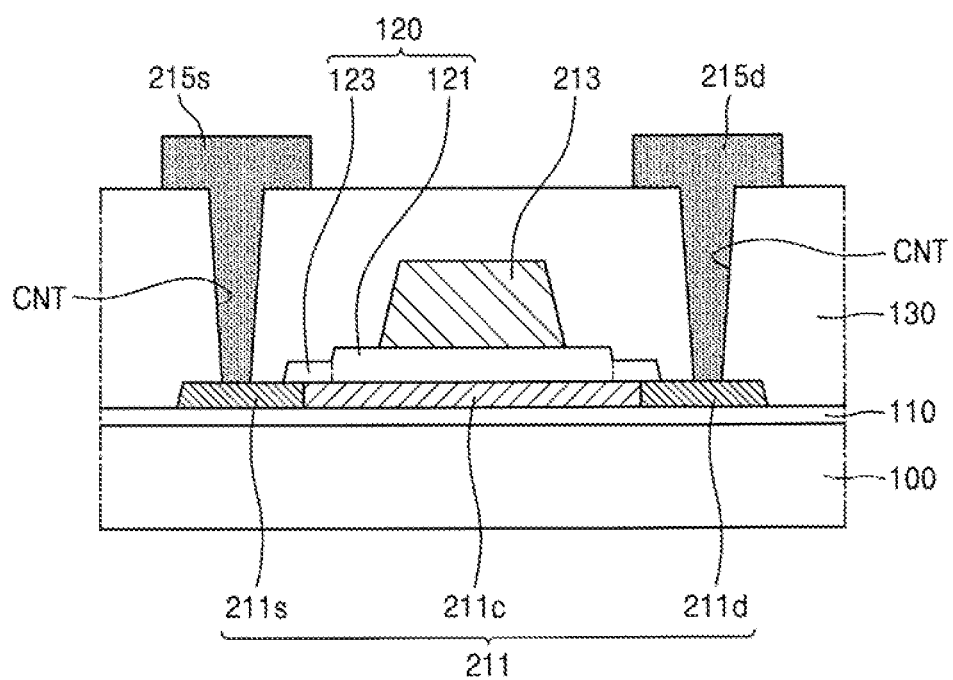

Referring to FIG. 5G, the interlayer insulating layer 130 may be formed on the gate electrode 213. The interlayer insulating layer 130 may be formed over substantially the entire surface of the substrate 100. The interlayer insulating layer 130 may include an inorganic material, for example, silicon oxide, silicon nitride, and/or silicon oxynitride; however, exemplary embodiments of the present invention are not limited thereto. The interlayer insulating layer 130 may be formed through a CVD method or an ALD method.

Through holes CNTs may be formed. The through holes CNTs may pass through the interlayer insulating layer 130. The through holes CNTs may expose the source region 211s and the drain region 211d.

The source electrode 215s and the drain electrode 215d may be formed. The source electrode 215s and the drain electrode 215d may include molybdenum (Mo), aluminum (Al), copper (Cu), and/or titanium (Ti); however, exemplary embodiments of the present invention are not limited thereto. The source electrode and the train electrode may be formed as a monolayer film or multilayer film. A conductive material layer may be formed by using various deposition processes, such as a CVD method, a PECVD method, LPCVD method, PVD method, sputtering method, or an ALD method; however, exemplary embodiments of the present invention are not limited thereto. The source electrode 215s and the drain electrode 215d may be formed by patterning the conductive material layer.

The TFTs and modified versions of the TFT described above may be applied to a display apparatus. Hereinafter, an example of application of the TFT of FIG. 3 to a display apparatus will now be described.

A display apparatus displays an image and may include a liquid crystal display, an electrophoretic display, an organic light emitting display, an inorganic light emitting display, a field emission display, a surface-conduction electron-emitter display, a plasma display, and a cathode ray display.

Hereinafter, as a display apparatus according to the current embodiment, an organic light-emitting display is described. However, the display apparatus according to the current embodiment is not limited thereto, and thus, various methods of display apparatuses may be used.

Figure 6:
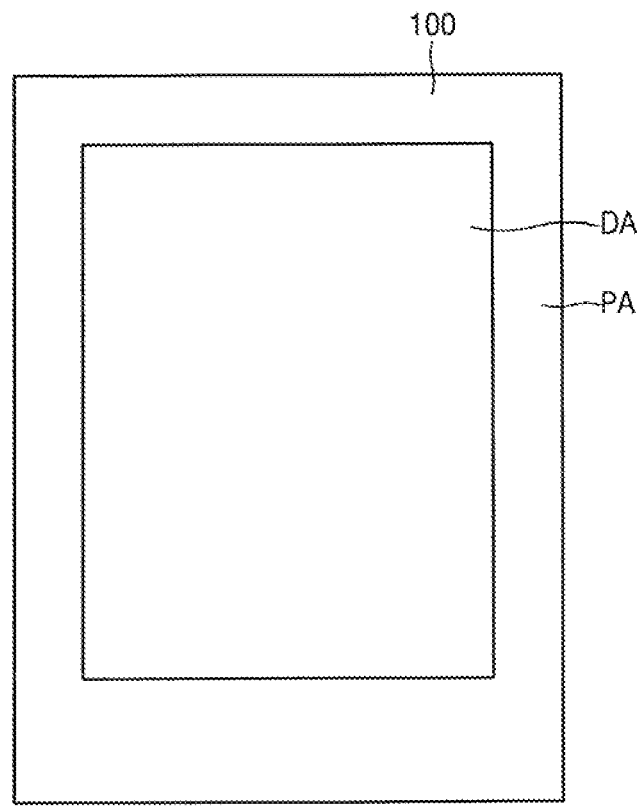
FIG. 6 is a schematic plan view illustrating a display apparatus according to an exemplary embodiment of the present invention.

FIG. 6 is a schematic plan view of a display apparatus according to an exemplary embodiment of the present invention. As illustrated in FIG. 6, the display apparatus may include the substrate 100. The substrate 100 may include a display area DA. The substrate may also include a peripheral area PA. The peripheral area PA may be disposed outside the display area DA. Various display devices, such as an organic light-emitting device (OLED) may be arranged on the display area DA of the substrate 100. Various wires may be arranged on the peripheral area PA of the substrate 100. The various wires may be configured to transmit electrical signals to be applied to the display area DA of the substrate 100.

Figure 7:
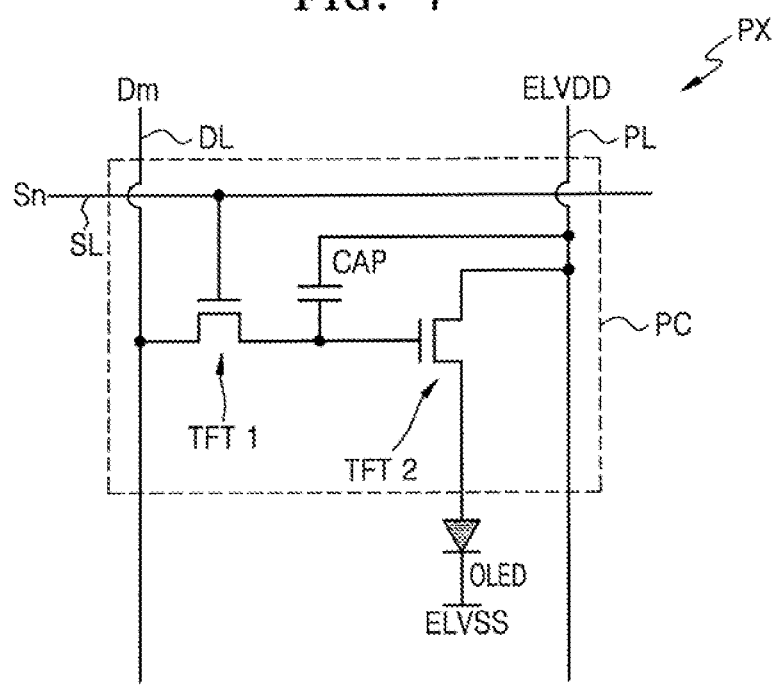
FIG. 7 is an equivalent circuit diagram illustrating a pixel of a display apparatus according to an exemplary embodiment of the present invention.

FIG. 7 is an equivalent circuit diagram illustrating a pixel of a display apparatus of FIG. 6 according to an exemplary embodiment of the present invention. In FIG. 7, a pixel including an OLED is illustrated; however, exemplary embodiments of the present invention are not limited thereto.

Referring to FIG. 7, each pixel PX may include a pixel circuit PC. The pixel circuit PC may be connected to a scan line Sl. The pixel circuit PC may also be connected to a data line DL. Each pixel PX may further include an OLED. The OLED may be connected to the pixel circuit PC.

The pixel circuit PC may include a first TFT TFT1, a second TFT TFT2, and a capacitor CAP. The first TFT TFT1 may be connected to the scan line SL. The first TFT TFT1 may also be connected to the data line DL. The first TFT TFT1 may be configured to transmit a data signal Dm inputted through the data line DL to the second TFT TFT2. The data signal Dm inputted through the data line DL to the second TFT TFT2 may be in response to a scan signal Sn inputted through the scan line SL.

The capacitor CAP may be connected to the first TFT TFT1. The capacitor CAP may also be connected to a driving voltage line PL. The capacitor CAP may store a voltage. The voltage may correspond to a difference between a voltage transmitted from the first TFT TFT1 and a driving voltage ELVDD supplying to the driving voltage line PL. The pixel PX may receive a voltage ELVSS. The voltage ELVSS may be connected to the OLED.

The second TFT TFT2 may be connected to the driving voltage line PL. The second TFT TFT2 may also be connected to the capacitor CAP. The second TFT TFT2 may control a driving current flowing in the OLED from the driving voltage line PL. The second TFT TFT2 may control the driving current corresponding to a voltage value stored in the capacitor CAP. The OLED may emit light. The light emitted by the OLED may have a predetermined brightness by a driving current.

Figure 8:
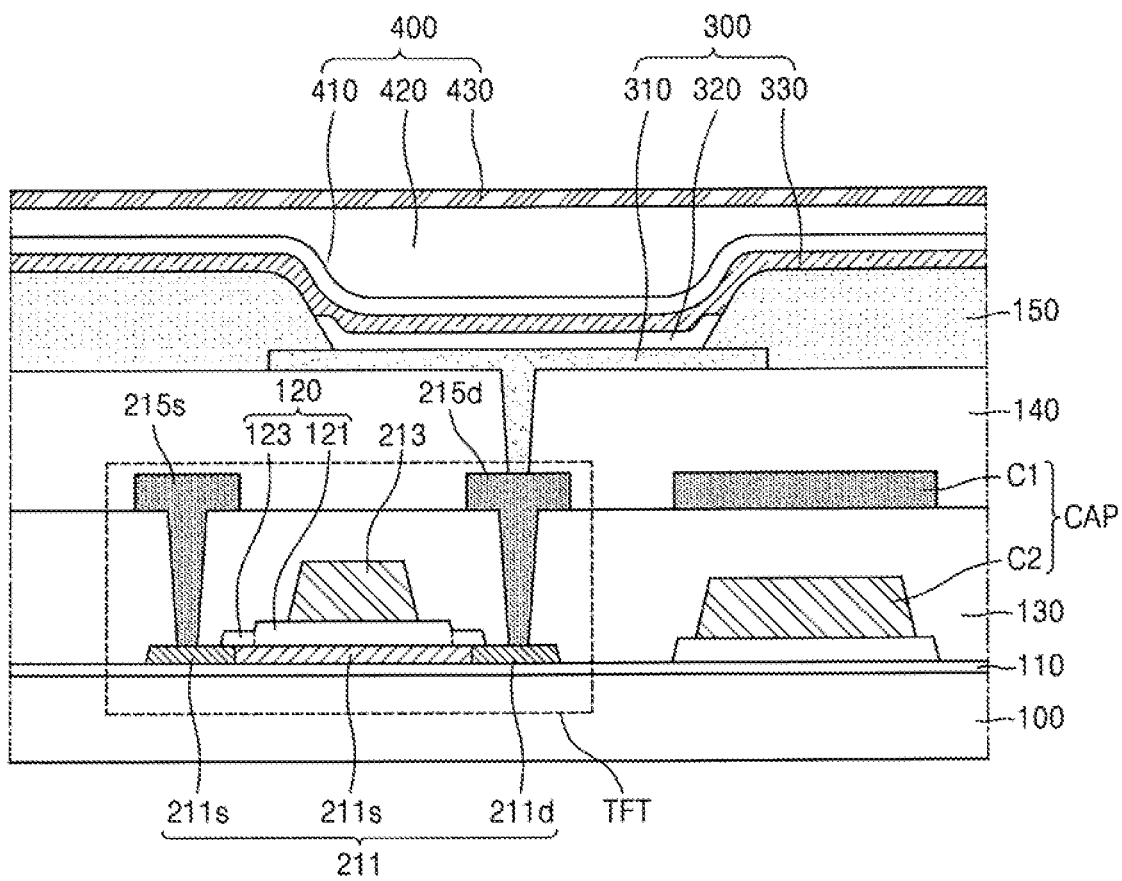
FIG. 8 is a cross-sectional view illustrating a part of a display area of the display apparatus of FIG. 6 according to an exemplary embodiment of the present invention.

FIG. 8 is a cross-sectional view illustrating a part of a display area DA of a display apparatus of FIG. 6 according to an exemplary embodiment of the present invention.

Referring to FIG. 8, in addition to the TFT, the display apparatus may further include a display device, such as an OLED 300 and a capacitor CAP.

The capacitor CAP may include a first electrode C1, a second electrode C2, and an insulating film. The insulating film may be interposed between the first electrode C1 and the second electrode C2. According to an exemplary embodiment of the present invention, the first electrode C1 may be disposed on the same layer as the gate electrode 213 using substantially the same material used to form the first electrode C1. The second electrode C2 may be disposed on the same layer as the gate electrode 213 using substantially the same material used to form the second electrode C2. The interlayer insulating layer 130 may be interposed between the first electrode C1 and the second electrode C2.

In FIG. 8, the capacitor CAP might not being overlap with the TFT. However, the capacitor CAP may overlap the TFT by being formed on the TFT.

A planarizing layer 140 may be formed on the TFT. The planarizing layer 140 may be formed on the capacitor CAP. The planarizing layer 140 may also be formed on the TFT and the capacitor CAP. For example, as illustrated in FIG. 8, if the OLED 300 is disposed on the TFT, the planarizing layer 140 may planarize an upper surface of a protection film. The protection film may cover the semiconductor device 120. The planarizing layer 140 may include an organic material, such as acryl, benzocyclobutene (BCB), or hexamethyldisiloxane (HMDSO); however, exemplary embodiments of the present invention are not limited thereto. In FIG. 8, the planarizing layer 140 is illustrated as a monolayer; however, the planarizing layer 140 may be variously modified. For example, the planarizing layer 140 may include a multilayer.

A pixel electrode 310, a counter electrode 330, and an OLED 300 may be disposed on the planarizing layer 140. The OLED 300 may include an intermediate layer 320. The intermediate layer 20 may include a light-emitting layer. As illustrated in FIG. 8, the pixel electrode 310 may be connected to the TFT. The pixel electrode 310 may be connected to the TFT by contacting one of the source electrode 215s or the drain electrode 215d through an opening formed in the planarizing layer 140. Accordingly, the pixel electrode 310 may be connected to the drain electrode 215d.

The pixel electrode 310 may be a transparent electrode. Alternatively, the pixel electrode 310 may be a reflective electrode. When the pixel electrode 310 is a transparent electrode, the pixel electrode 310 may include indium tin oxide (ITO), indium zinc oxide (IZO), zinc oxide (ZnO) or indium(III) oxide ($In_2O_3$); however, exemplary embodiments of the present invention are not limited thereto. When the pixel electrode 310 is formed as a reflective electrode, the pixel electrode 310 may include a reflection film. The reflection film may include silver (Ag), magnesium (Mg), aluminum (Al), platinum (Pt), palladium (Pd), gold (Au), nickel (Ni), neodynium (Nd), iridium (Ir), chromium (Cr), or compound thereof; however, exemplary embodiments of the present invention are not limited thereto. The pixel electrode 310 may further include a transparent film. The transparent film may include indium tin oxide (ITO), indium zinc oxide (IZO), zinc oxide (ZnO), or indium (III) oxide ($In_2O_3$); however, exemplary embodiments of the present invention are not limited thereto. According to an embodiment of the present invention, the pixel electrode 310 may include an indium tin oxide (ITO)/silver (Ag)/indium tin oxide (ITO) structure.

A pixel defining layer 150 may be disposed on the planarizing layer 140. The pixel defining layer 150 may serve to define a pixel. The pixel defining layer 150 may define a pixel by including an opening corresponding to each sub-pixel. For example, the opening that exposes at least a central portion of the pixel electrode 310. As illustrated in FIG. 8, the pixel defining layer 150 may prevents the occurrence of an arc on an edge of the pixel electrode 310 by increasing a distance from an edge of the pixel electrode 310 to the pixel defining layer 330 on the pixel electrode 310. The pixel defining layer 150 may include an organic material, such as polyimide (PI) or hexamethyldisiloxane (HMDSO); however, exemplary embodiments of the present invention are not limited thereto.

The intermediate layer 320 of the OLED 300 may include a low molecular weight material or a polymer material. If the intermediate layer 320 includes a low molecular material, the intermediate layer 320 may be formed in a single or a composite structure including a hole injection layer (HIL), a hole transport layer (HTL), an emission layer (EML), an electron transport layer (ETL), and an electron injection layer (EIL). The intermediate layer 320 may include various organic materials, such as copper phthalocyanine (CuPc), N,N'-Di(naphthalene-1-yl)-N,N'-diphenyl-benzidine (NPB), and tris-8-hydroxyquinoline aluminum (Alq3); however, exemplary embodiments of the present invention are not limited thereto. The layers may be formed by an evaporation method; however, exemplary embodiments of the present invention are not limited thereto.

When the intermediate layer 320 includes a polymer material, the intermediate layer 320 may have a structure including a hole transport layer (HTL) and an emission layer (EML). The hole transport layer (HTL) may include poly-(2,4)-ethylene-dihydroxy thiophene (PEDOT). The emission layer (EML) may include a polymer material, such as poly p-phenylene vinylene (PPV) or polyfluorene. However, exemplary embodiments of the present invention are not limited thereto. The intermediate layer 320 may be formed by using a screen printing method, an ink jet printing method, or a laser induced thermal imaging (LITI) method; however, exemplary embodiments of the present invention are not limited thereto.

The intermediate layer 320 may include various structures. The intermediate layer 320 may include a single body layer. The single body layer may be disposed over substantially the entire plurality of the pixel electrodes 310. Alternatively, the intermediate layer 320 may include multiple layers patterned to correspond to each of the pixel electrodes 310.

The counter electrode 330 may face the pixel electrode 310. The intermediate layer 320 may be disposed between the counter electrode 330 and the pixel electrode 310. The counter electrode 330 may correspond to the plurality of the pixel electrodes 310 by being formed as a single body. The counter electrode 330 may be disposed on a plurality of OLEDs. For example, the pixel electrode 310 may be patterned to each pixel. The counter electrode 330 may be formed to apply a common voltage to the entire pixels. The counter electrode 330 may be a transparent electrode. Alternatively, the counter electrode 330 may be a reflective electrode.

Holes and electrons may be respectively injected to the pixel electrode 310 and the counter electrode 330 of the OLED 300. The holes and the electrons may combine in the intermediate layer 320. Therefore, light may be emitted from the light-emitting layer of the intermediate layer 320.

The OLED 300 may be damaged by external moisture or oxygen. Therefore, a thin film encapsulation layer 400 may cover the OLED 300. The thin film encapsulation layer 400 may protect the OLED 300 from external moisture or oxygen. The thin film encapsulation layer 400 may include at least one organic encapsulation layer. The thin film encapsulation layer 400 may also include at least one inorganic encapsulation layer. For example, as illustrated in FIG. 8, the thin film encapsulation layer 400 may include a first inorganic encapsulation layer 410, an organic encapsulation layer 420, and a second inorganic encapsulation layer 430.

The first inorganic encapsulation layer 410 may cover the counter electrode 330. The first inorganic encapsulation layer 410 may include silicon oxide, silicon nitride, and/or silicon oxynitride; however, exemplary embodiments of the present invention are not limited thereto. Another layer, for example, a capping layer, may be interposed between the first inorganic encapsulation layer 410 and the counter electrode 330. The shape of the first inorganic encapsulation layer 410 may be formed in accordance to the shape of a structure disposed below. Therefore, as illustrated in FIG. 8, an upper surface of the first inorganic encapsulation layer 410 might not be substantially flat. The organic encapsulation layer 420 may cover the first inorganic encapsulation layer 410. However, dissimilar to the first inorganic encapsulation layer 410, an upper surface of the organic encapsulation layer 420 may be formed as substantially flat. The organic encapsulation layer 420 may include at least one selected from the group consisting of polyethylene terephthalate (PET), polyethylene naphthalate (PEN), polycarbonate, polyimide (PI), polyethylene sulfonate, polyoxymethylene (POM), polyallylate, and hexamethyldisiloxane (HMDSO); however, exemplary embodiments of the present invention are not limited thereto. The second inorganic encapsulation layer 430 may cover the organic encapsulation layer 420. The second inorganic encapsulation layer 430 may include silicon oxide, silicon nitride, and/or silicon oxynitride; however, exemplary embodiments of the present invention are not limited thereto.

Since the thin film encapsulation layer 400 may have a multilayer structure including the first inorganic encapsulation layer 410, organic encapsulation layer 420, and the second inorganic encapsulation layer 430, although a crack may occur in the thin film encapsulation layer 400, the crack might not be connected between the first inorganic encapsulation layer 410 and the organic encapsulation layer 420, or between the organic encapsulation layer 420 and the second inorganic encapsulation layer 430 through the multilayer structure. Therefore, the formation of a penetration path of external moisture or oxygen into the OLED 300 may be prevented or may be minimized.

The thin film encapsulation layer 400 may be replaced by a sealing substrate. The sealing substrate may include glass. The sealing substrate may be bonded to a sealant. The sealant may be disposed to surround the substrate 100. The sealant may also be disposed to surround the display region DA. A polarizing plate, a color filter, or a touch panel may further be disposed on the thin film encapsulation layer 400. Alternatively, the polarizing plate, the color filter, or the touch panel may be disposed on the sealing substrate.

According to an exemplary embodiment of the present invention, the second photoresist pattern PR2 may be formed to surround the sidewalls of the gate electrode 213. The second photoresist patter PR2 may be disposed to prevent a short circuit between the gate electrode 213 and the semiconductor layer 211 in the manufacturing process. Therefore, a high quality TFT and a display apparatus including the same may be formed.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:
1. A method of manufacturing a thin film transistor, the method comprising:
   forming a semiconductor layer over a substrate;
   sequentially forming a gate insulating material layer and a gate electrode material layer on the substrate to cover the semiconductor layer;
   forming a first photoresist pattern on the gate electrode material layer;

forming a gate electrode by etching the gate electrode material layer using the first photoresist pattern as a mask;

forming a second photoresist pattern covering both sidewalls and an upper surface of the gate electrode; and forming a gate insulating film by etching the gate insulating material layer using the second photoresist pattern as a mask, the gate insulating film including a first region and a second region having portions disposed at opposite sides of the first region, and a thickness of the first region is different than a thickness of the portions of the second region, wherein a portion of the first region and the portions of the second region do not overlap the gate electrode in a thickness direction of the substrate.

2. The method of claim 1, wherein the second photoresist pattern is formed by reflowing the first photoresist pattern.

3. The method of claim 1, further comprising performing a conducting process to increase a carrier concentration of a portion of the semiconductor layer.

4. The method of claim 3, wherein the etching of the gate insulating material layer comprises a dry etching process, and the conducting process uses a gas used in the dry etching process.

5. The method of claim 1, wherein a step shape is included in the gate insulating film at a boundary between the first region and the second region.

6. The method of claim 5, wherein the gate electrode is disposed on the first region, and a width of an upper surface of the first region in a direction parallel to a top surface of the substrate is greater than a width of a lower surface of the gate electrode in the direction parallel to the top surface of the substrate.

7. The method of claim 5, wherein a thickness of the second region is gradually reduced in a direction away from the first region.

8. The method of claim 1, wherein the semiconductor layer comprises an oxide semiconductor.

9. The method of claim 1, wherein a buffer layer is formed on the substrate and the buffer layer is positioned between the semiconductor layer and the substrate.

* * * * *